United States Patent [19]

Crochiere et al.

[11] 4,210,825
[45] Jul. 1, 1980

[54] LINEAR DIFFERENTIAL CHARGE SPLITTING INPUT FOR CHARGE COUPLED DEVICES

[75] Inventors: Ronald E. Crochiere, Berkeley Heights, N.J.; Carlo H. Sequin, Berkeley, Calif.; Michael F. Tompsett, New Providence, N.J.

[73] Assignee: Bell Telephone Laboratories, Incorporated, Murray Hill, N.J.

[21] Appl. No.: 905,169

[22] Filed: May 12, 1978

Related U.S. Application Data

[63] Continuation-in-part of Ser. No. 748,485, Dec. 8, 1976.

[51] Int. Cl.² .................. G11C 19/28; H01L 29/78
[52] U.S. Cl. .................................. 307/221 D; 357/24
[58] Field of Search ....................... 357/24; 307/221 D

[56] References Cited

U.S. PATENT DOCUMENTS

| | | | |
|---|---|---|---|
| 3,777,186 | 12/1973 | Chang | 357/24 |
| 3,876,952 | 4/1975 | Weimer | 357/24 |
| 3,906,359 | 9/1975 | Blaha et al. | 357/24 |
| 3,930,255 | 12/1975 | Means | 357/24 |
| 4,005,377 | 1/1977 | Engeler et al. | 357/24 |
| 4,032,767 | 6/1977 | Lagnado | 357/24 |
| 4,099,197 | 4/1978 | Ibrahim et al. | 357/24 |

OTHER PUBLICATIONS

Sequin et al., *Charge Transfer Devices,* Academic Press, N.Y. (7/75), pp. 25–31, 48–50, 60–61, 218–219.
Lancaster et al., "A Circulating CCD with Novel Input and Output Structures," IEEE Int. Electron Devices Meeting (12/74), Tech. Dig., pp. 108–111.
Sealer et al., "A Dual Differential Charge-Coupled Analog Delay Circuit," IEEE J. Solid-State Circuits, vol. SC-11 (2/76), pp. 105–108.
Sequin et al., "A symmetrically Balanced Linear Differential Charge-Splitting Input for Charge-Coupled Devices," IEEE Trans. Electron Devices, vol. ED-24 (6/77), pp. 746–750.

*Primary Examiner*—Gene M. Munson
*Attorney, Agent, or Firm*—Herbert M. Shapiro

[57] ABSTRACT

A charge transfer device includes two channels and a common input structure. The input structure is operated in a manner to divide a charge packet of signal-independent size into two complementary packets for movement along the two channels. A single-channel embodiment employs a similar input structure.

6 Claims, 10 Drawing Figures

LINEAR DIFFERENTIAL CHARGE SPLITTING INPUT FOR CHARGE COUPLED DEVICES

CROSS-REFERENCE TO RELATED APPLICATION

This application is a continuation in part of patent application Ser. No. 748,485, filed Dec. 8, 1976 for R. E. Crochiere, C. H. Sequin and M. F. Tompsett.

FIELD OF THE INVENTION

This invention relates to semiconductor apparatus, and more particularly to charge-coupled devices or, generically, charge transfer devices.

BACKGROUND OF THE INVENTION

Charge transfer devices (CTD's) are well known in the art. Such a device comprises a semiconductor substrate, typically with a single surface channel, to which an arrangement of electrodes is coupled for defining a path. The electrodes are electrically isolated from one another and adapted to move charge packets along a sequence of potential wells formed in response to fixed amplitude control phase-related voltages applied to the electrodes in sets in a now well-understood manner.

A variety of input structures are known for introducing charge into such devices. Each of these input structures responds to an input information bearing and so varying signal voltage which is determined with respect to some reference potential. As a consequence, the charge which is developed in the input structure is a function of the applied signal.

A prior art improvement over a single-channel device uses two channels where the output information signal is taken as the difference between the outputs of the two channels. By using such a differential mode, the effects of dark current, temperature dependent drift, clock pickup, and even harmonic distortions detrimental in single-channel devices, are significantly reduced since they appear as common mode noise voltages and are thus cancelled by a difference amplifier employed at the output.

To realize the full benefit of the two-channel approach, the charge has to be introduced in an exactly complementary form into the two transfer channels. In prior art devices using two channels, two separate signal information inputs were provided to generate two charge packets independently where the charges had no fixed relationship with one another. Further, the generation of the two charge packets required amplifier circuits with attending losses in linearity and symmetry as is well known.

BRIEF DESCRIPTION OF THE INVENTION

The present invention is based on the recognition that the generation of a charge packet of information signal-independent size at the input of a CTD provides a number of advantages. The advantages are particularly clear for a two-channel device where a charge packet of information signal-independent or fixed size is separated into two packets which have a fixed relationship to one another. Since the sum of the charge packets ($Q_A+Q_B=Q_O$) is a fixed quantity, the common mode charge is suppressed. For a two-channel device specifically, an input structure, in accordance with an embodiment of this invention, includes a charge injection circuit and two input gates to each of which a voltage is applied. The charge packet $Q_O$ is formed by conventional techniques in the charge injection circuit preceding the gates. The gates are then operated, responsive to input information signals, in a manner to develop two charge packets ($Q_A$, $Q_B$) of complementary sizes, the difference between which is determined by the difference between information signal-dependent voltages applied to the gates. The size of the two packets varies with respect to one another because the input information signal varies in accordance with the intelligence represented by the input signals. In the normal use of this device, the information varies continuously in analogue fashion representative of that intelligence. This is to be contrasted with prior art structures where the size of each of the information signal charge packets is separately determined at the point of injection from a separate source as indicated hereinbefore and the two packets are determined by clock pulses.

In one specific embodiment of such a two-channel device, an input diode, a metering electrode, and a pair of gates is employed at the input. The metering electrode can be operated in the "voltage input" or in the "charge preset" mode (see *Charge Transfer Devices*, by C. H. Sequin and M. F. Tompsett, page 48, Academic Press, 1975) to produce a single charge packet of a fixed size in each clock cycle of operation. Each charge packet so generated is subsequently transferred to the input region defined by the two gates where the charge packet is split into two packets which depend on the momentary information signal voltages applied to the two gates.

In those embodiments of this invention where the symmetry of the input gates is sufficiently precise, the charge packets which are divided into complementary portions need not be information independent but can fluctuate from packet to packet as long as common mode noise supression is not important.

Devices in accordance with aspects of this invention are disclosed in *IEEE Transactions on Electron Devices*, Vol. ED-24, No. 6, June 1977, pages 746–750.

Figure 2:
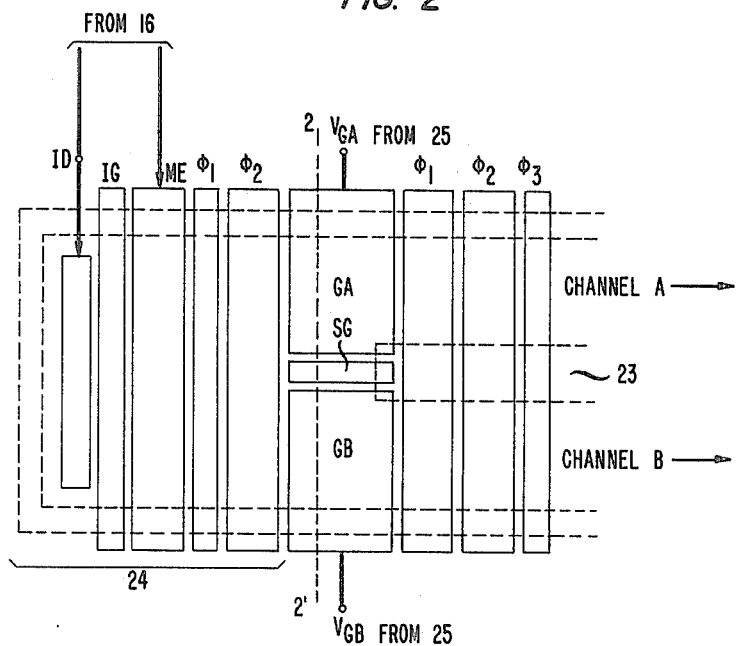
FIG. 2 is a schematic top view of a portion of a two-channel CTD arrangement of a type useful in the device of FIG. 1.
Figure 7:
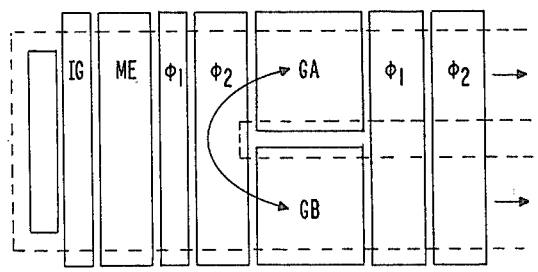
Figure 8:
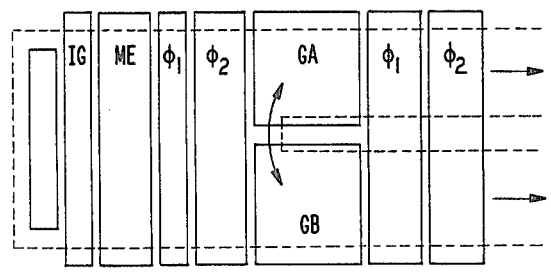
Figure 9:
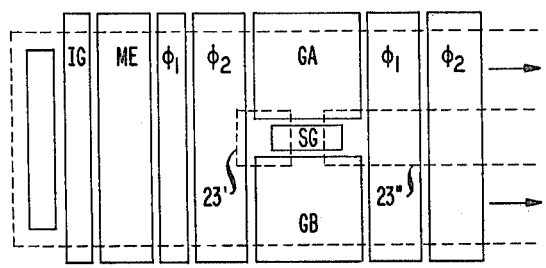
Figure 10:
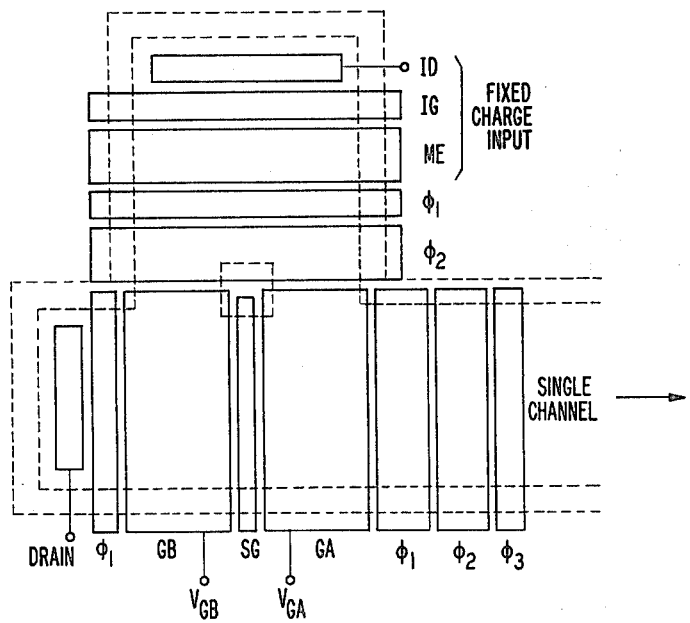

Each of FIGS. 3, 4, 5, and 6 is a cross-sectional view of a portion of the input structure of FIG. 2 showing alternative charge division therein in accordance with this invention;

FIGS. 7, 8, and 9 are schematic top views of alternative two-channel CTD arrangements with inputs in accordance with this invention; and, FIG. 10 is a schematic top view of a single-channel arrangement with an input structure in accordance with this invention.

DETAILED DESCRIPTION

Figure 1:
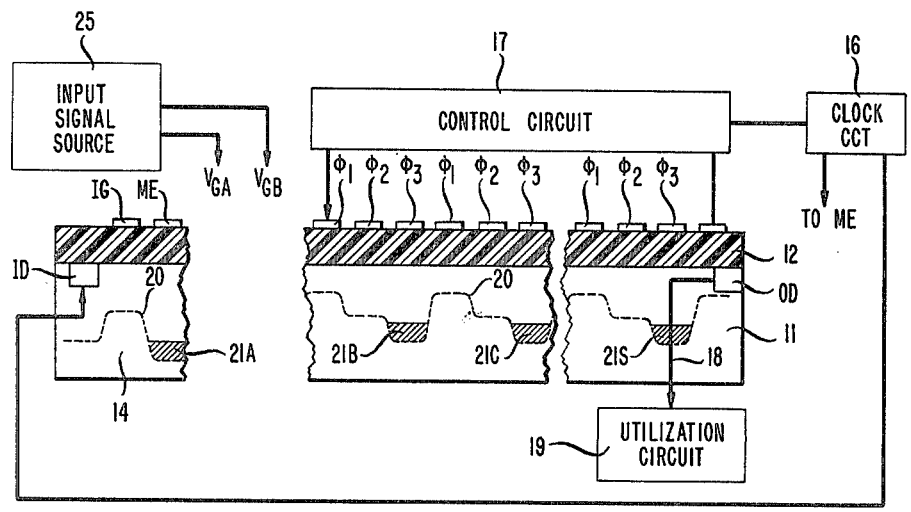
FIG. 1 is a cross-section diagram of a three-phase semiconductor charge transfer device with means for forming complementary charge packets in accordance with this invention.

FIG. 1 shows a generalized CTD arrangement 10 including a semiconductor layer 11, an insulating coating 12, and an arrangement of electrodes $\phi_1$, $\phi_2$, $\phi_3$ organized in a three-phase arrangement to form a charge packet transfer path in the semiconductor layer. The semiconductor layer includes an input portion or region 14 characterized by an input diode ID and an input gate IG for defining a charge packet in a metering potential well formed under a metering electrode ME. The charge accumulates in the well in response to a voltage supplied by a clock source designated 16 in the figure. The charge accumulated in response to the clock signal in each clock cycle is advanced, in a well-known manner, by the provision of "charge transfer" control pulses applied to the electrodes in a multiphase manner by charge transfer pulse control circuit 17. The charge so transferred passes at least one sense output tap indicated by arrow 18 and thus applies output information signals to utilization circuit 19 by means of an output diode OD. Layer 11 may comprise a surface channel, or a bulk channel. In either case, a charge transfer channel is defined in a well-understood manner and layer 11 is taken to include such a channel.

The various sources and circuits may be any such elements capable of operating in accordance with this invention.

FIG. 1 also shows, specifically, the semiconductor layer 11 as having superimposed thereon a contoured broken line 20 which depicts, in a well-understood manner, the surface potential in the layer at different positions along the transfer channel. The contour of line 20 is determined by the potential applied to the electrodes of FIG. 1 during one phase of a clock cycle. In the typical situation, like-designated electrodes are interconnected electrically in sets (or series) and circuit 17 applies control clock pulses $\phi_1$, $\phi_2$, and $\phi_3$ to the sets in sequence. The pulse pattern on the electrodes determines the peaks and wells of the contour as shown for one phase and wherein successive pulses cause the contours to move. The (potential) wells store charge packets which are thus moved along the layer 11 in response to the succession of (three-phase) pulses in a well-understood manner.

Of course, the amount of charge or the presence or "absence" of a (prescribed) charge in the input portion 14 is determined by a clock signal applied to an input gate IG during a given clock cycle in accordance with this invention. The amount of charge in a potential well during one phase is represented by cross-hatched areas designated 21A, 21B, . . . 21s. Area 21A is represented at the input to layer 11 and constitutes the metering well under metering electrode ME. Area 21s is a representative sense output tap.

FIG. 2 is a top view of a CTD device showing a charge divider input implementation. The figure shows a two-channel arrangement where the channels are designated channel A and channel B for movement of charge packets to the right as viewed. The channels are separated by a channel "divider" (or "stop") area 23 and are preceded by an input portion designated 24 in the figure. The input portion is common to the two channels and is separated therefrom by input gate electrodes GA and GB associated with channels A and B, respectively.

The input portion of the device includes an input diode ID, an input gate IG and a metering electrode ME. The metering electrode is followed by first and second phase electrodes $\phi_1$ and $\phi_2$ operative in synchronization with the first two phases of the three-phase charge packet advance electrodes $\phi_1$, $\phi_2$ and $\phi_3$ shown for the channels. A channel divider electrode SG separating gate electrodes GA and GB is shown in this particular embodiment.

The metering electrode can be operated either in the familiar voltage input or in the charge preset mode to produce charge packets of a fixed size $Q_O$ in each clock cycle. These charge packets are subsequently transferred to the complementary information signal input consisting of the two gates GA and GB, where each arriving charge packet $Q_O$ is split into two packets of sizes $Q_A$ and $Q_B$, respectively, which depend upon the momentary varying information signal voltages $V_{GA}$ and $V_{GB}$ applied to the two gates by an input signal source 25.

Figure 3:
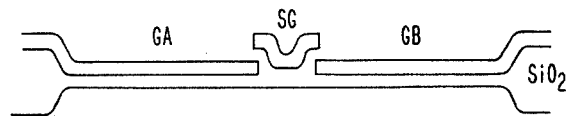
Figure 4:
Figure 5:
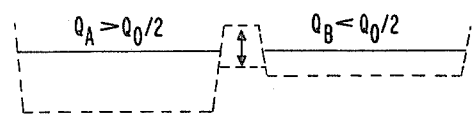
Figure 6:
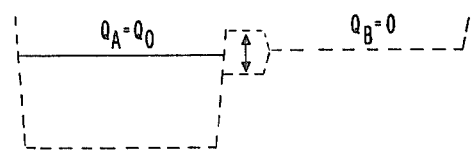

The device is operated such that the two charge packets can equilibrate in the splitting process so that they achieve equal interface potentials before they are separated and transferred into the two individual channels. More charge carriers will thus collect under the gate which has the higher potential (for an N-channel device) applied to it and which therefore generates a deeper potential well underneath. As shown below, the charge $Q_A$ (collected under the gate electrode GA) is related to the charge $Q_B$ (collected under GB) by the relationship $Q_A - Q_B = a(V_{GA} - V_{GB})$ provided that the areas of the gate electrodes are equal, where "a" is an information signal-independent parameter. This process can be understood more fully by looking at the cross-sectional view taken along line 2—2' of FIG. 2 through the two input gates as depicted in FIGS. 3, 4, 5, and 6. FIG. 3 shows the structure with no voltages applied. FIG. 4 shows the potential profiles and charge distributions for the balanced case ($V_{GA} = V_{GB}$) where the packet $Q_O$ is split into two equal parts, each representing the reference level. FIG. 5 depicts the general unbalanced case where a difference $Q_A - Q_B$ is produced by a voltage difference between the two input gates GA and GB due to different information signal voltages $V_{GA}$ and $V_{GB}$ applied as shown in FIG. 2. FIG. 6, finally, illustrates one extreme case of saturation (largest useable input information signal $V_{GA} - V_{GB}$) where the whole charge packet $Q_O$ is moved to one side and thus to one channel. In order to give a clean saturation behavior, the charge input is designed so that the full charge packet $Q_O$ can be handled by each one of the two individual output channels.

For a quantitative analysis of the charge-splitting process we refer again to FIGS. 2, 3, 4, 5, and 6. For generality, we drop the requirement that the two input gates GA and GB be of equal size. This will allow us to estimate the effect of misalignment errors of the electrodes with respect to the channel geometry.

After equilibration of the two fractional charge packets, the interface potential under both input gates will be the same:

$$\phi_s = V_A + V_O - V_A V_O + V_O^{2\frac{1}{2}} = V_B + V_O - V_B V_O + V_O^{2\frac{1}{2}},$$

where $$V_A = (V_{GA} - V_{FB}) + q_A/C_{ox}$$

and correspondingly for $V_B$. The structural parameter $V_O = q N_A \epsilon_O \epsilon_s / C_{ox}^2$ is the same for both gates, where q is electron charge, $\epsilon_o$ is the permittivity of vacuum, $\epsilon_s$ is the relative permittivity of silicon, $N_A$ is the number of acceptors per cubic centimeters, and $C_{ox}$ is the oxide capacitance per unit area. It thus follows that $$V_A = V_B$$

and thus $$C_{ox}V_{GA}+q_A=C_{ox}V_{GB}+q_B,$$

in order that the original equality be satisfied. In the above equation, $q_A$ and $q_B$ represent charge densities under the respective electrodes GA and GB. The size of the actual charge packets is then obtained by multiplying with the respective gate electrode areas $A_A$ and $A_B$. The sum of the two charge packets is given by $Q_O$, and it then holds that $$A_A q_A + A_B q_B = Q_A + Q_B = Q_O$$

and it follows that for $0 \leq Q_A \leq Q_O$ $$Q_A = A q_A = \frac{A_A Q_O - A_A A_B C_{ox}(V_{GA} - V_{GB})}{A_A + A_B}.$$

Since the zero reference signal is represented by $Q_O/2$, the actual signal in one of the two individual output channels is $$Q_A - Q_O/2 = \frac{Q_O}{2} \frac{A_A - A_B}{A_A + A_B} - \frac{A_A A_B}{A_A + A_B} C_{ox}(V_{GA} - V_{GB}).$$

Similarly, $$Q_B - Q_O/2 = \frac{-Q_O}{2} \frac{A_A - A_B}{A_A + A_B} - \frac{A_A A_B}{A_A + A_B} C_{ox}(V_{GA} - V_{GB}).$$

Thus:

$$Q_A - Q_B = Q_O \frac{A_A - A_B}{A_A + A_B} - \frac{2 A_A A_B}{A_A + A_B} C_{ox}(V_{GA} - V_{GB})$$

with $Q_A + Q_B = Q_O$.

For the case of precise symmetry of alignments, where the two gate electrode areas are equal ($A_A = A_B = A_G$), the above results reduce to:

$$Q_A = Q_O/2 - \tfrac{1}{2} A_G C_{ox}(V_{GA} - V_{GB}),$$

$$Q_B = Q_O/2 + \tfrac{1}{2} A_G C_{ox}(V_{GA} - V_{GB}),$$

$$Q_A - Q_B = -A_G C_{ox}(V_{GA} - V_{GB}),$$

or $$Q_A - Q_B = a(V_{GA} - V_{GB}).$$

Again, with $Q_A + Q_B = Q_O$, where $a = A_G C_{ox}$, a signal-independent structural parameter. In the case of precise symmetry of alignments, the foregoing equations show that the charge packets $Q_A$ and $Q_B$ are precisely complementary and that the charge packet difference ($Q_A - Q_B$) is linearly proportional to the input signal difference voltage ($V_{GA} - V_{GB}$) as desired. Moreover, even in the case of nonalignment ($A_A$ and $A_B$ not equal). The equations show that the charge packet difference ($Q_A - Q_B$) will still be linearly related to the input signal voltage difference ($V_{GA} - V_{GB}$) with an (additive) offset that is signal independent, and this offset will be the same for all subsequent packets so long as $Q_O$ is kept the same for all these packets. Thus, it is important that $Q_O$ be the same fixed value for all packets in the case of nonalignment ($A_A$ and $A_B$ not equal).

For the perfectly symmetrical case, the difference mode signal charge $Q_A - Q_O/2$ does not depend on $Q_O$. Therefore, if this input is used with a differential charge-coupled delay line with two separate channels carrying complementary signals and with a difference amplifier at the output, fluctuations in the size of $Q_O$ will cancel.

The above analysis relies on the fact that the two partial charge packets $Q_A$ and $Q_B$ reach a common interface potential just before they are completely separated. FIGS. 7, 8, and 9 illustrate several structures in which a common interface potential can be reached prior to separation. The dotted lines in the figures indicate the locations of two relatively narrow charge transfer channels separated by channel stop diffusion (implant or thick oxide regions as is well known) growing out of a single, relatively wide input channel. The implementation shown in FIG. 7, is operated in a three-phase manner, with two input gates, GA and GB, serving the function of dc electrodes held in the voltage range between the low signal pulse potential and half the peak signal pulse potential. The electrodes are made at least twice the length (taken along direction of charge movement) of a regular transfer electrode so that they can accommodate a full charge packet $Q_O$ within that limited potential range. Equilibration takes place when phase $\phi_2$ turns off and the charge packet $Q_O$ is pushed under the input gates. Charge continues to equilibrate around the channel divider area through the region under electrode $\phi_2$ adjacent gates GA and GB until the interface potential under phase $\phi_2$ falls below the common interface potential produced by the split charge packet under the input gates.

Near turnoff (when the interface potential under the phase two electrode $\phi_2$ is almost equal to the potential under gates GA and GB), the equilibration path between the two wells defined by gates GA and GB is of low conductivity and, in addition, may be poorly defined due to spatial variations of the interface potential. Furthermore, since the discharge of the large area under phase two electrode $\phi_2$ occurs simultaneously with the equilibration process, this electrode is not turned off too quickly lest proper equilibration be forestalled by the dynamics of the discharge under the influence of the electrical fringe fields at the edges of the $\phi_2$ electrode.

Alternatively, the beginning of the channel divider is placed further to the right under the input gates themselves, and the remaining uncovered gap between the gates is bridged by a self-aligned diode as shown in FIG. 8. The self-aligned diode is formed during the normal processing sequence by a diffusion step which employs the gates as a mask. In this arrangement, charge can equilibrate during the whole time that it resides under the input gates, and the dynamics of the discharge now are helpful since they tend to separate the two partial charge packets with time constants much shorter than the equilibration time constants between the two wells. For a fixed operating rate, the channel width, the electrode length, and the dimensions of the passage through the self-aligned diode can be properly chosen to obtain the right time constants in accordance with well-understood considerations.

Alternatively, a special separation gate SG is introduced, between two channel stop regions 23' and 23", to replace the self-aligned diode as indicated in FIG. 9. During the first part of phase $\phi_3$, this gate is pulsed to allow equilibration of the interface potentials under the two input gates. Then, before the charge starts to transfer to phase electrode $\phi_1$, the gate is turned off resulting in a complete separation of the two charge packets.

The noise introduced by this charge-splitting input scheme does not depend on the noise associated with the generation of the charge packet $Q_O$ as long as this input is used in conjunction with differential charge detection. The noise produced in the splitting process can be estimated by assuming that the variance of the interface potential difference under the two input gates is given by $\eta kT/C$ where the parameter, which depends on the mechanism of equilibration, lies in the interval $0.5 \leq \eta \leq 1.0$. The value for C to be used in the above expression is the capacitance resulting from the series connection of the two metering well capacitances, k is Boltzmann's constant and T is absolute temperature. If the capacitance under each of the input gates is $C_G$, the rms noise charged observed differentially between the two channels will be $2\eta kT/C_G$. This value is thus, in principle, the same as that calculated for a differential CCD of the same input dimensions with two separate charge inputs which equilibrate independently with a voltage source. This means that the obtainable signal-to-noise charge ratios with this new differential input scheme are basically the same as for a single-channel approach using the same total channel width.

The input arrangement of FIG. 2 is particularly suited for differential charge-coupled delay lines, especially if balanced input signals are available, say, from a two-wire line or from a coupling transformer. In such a case, the input circuit becomes completely symmetrical. If only a single-ended input signal, which is referenced to systems ground, is available, the second input gate is held at a suitable dc reference potential which should be about one-fourth of the peak signal pulse potential for the three-phase implementations of FIG. 2. The differential nature of this input scheme then eliminates the need to generate a special complementary input signal for the second channel.

The charge-splitting input in accordance with this invention is useful also as an input for a single-channel device when the input signals are available in a balanced format. The partial charge packet $Q_B$ injected into one channel can simply be discarded into a reverse-biased drain diode. However, for a single-channel approach, the layout can readily be rearranged as shown in FIG. 10 so that equilibration between the two input gates (GA and GB) can take place across the whole channel width, thus permitting high speed operation. In this form, the charge-splitting input (using the separation gate SG of FIG. 10) combines the advantages of the voltage input and of the charge preset input arrangements while avoiding some of their problems. Of the former, it has retained the speed and the well-defined sampling point given by the turnoff of the separation gate without the nonlinearities arising from the varying depletion capacitance. It thus avoids the well-understood problems connected with the undesirably changing sampling point which is especially troublesome for signal frequencies near the Nyquist rate which result from the unidirectional equilibration process in the charge preset method. The linearity of the new input exceeds the performance of the charge preset method at high frequencies, and the sensitivity to threshold voltage differences is strongly reduced since the two input gates are formed in the same electrode level.

Considering the splitting noise above, which is fully correlated in both channels, the signal-to-noise ratio would not change by taking the output signal from only one of the two channels. However, in the single-channel approach, the noise associated with $Q_O$ does not cancel and the variances of the two noise sources have to be added. It turns out that the overall signal-to-noise ratio is again comparable to the one obtainable in a single-channel device of equal channel width using one of the conventional inputs.

Whether the charge-splitting input is used with a single or with differential channels and with single-sided or with balanced input signals, the transfer channels are never completely flooded with charge, even with extreme voltages applied to the input gates, since the charge input limits the amount of charge available in any one clock cycle to $Q_O$. On the other hand, the common mode signal range has its limits. When both input gates are biased below the low resting potential of the pulsed transfer electrodes, no charge is injected into any of the channels. The charge that cannot be inserted into the transfer channels can be made to flow back to the metering well under metering electrode ME rather than being injected into the substrate, if the $\phi 1$ transfer electrode following the metering well is held at a potential somewhat above the resting potential. At the other extreme, very high potentials on the input gates can generate deep potential wells which are unable to empty their carriers into the transfer channels. When the potential is subsequently reduced, these carriers can add up to a charge packet larger than $Q_O$ and, depending on the charge-handling capability of the transfer channel, some of this charge may be injected into the substrate. To avoid overfilled or completely empty charge packets, either of which would impair the charge transfer in the signal channels, the input signals should be limited accordingly. This corresponds to the precautions that have to be taken in prior art devices.

Although several possible implementations of the differential input scheme have been discussed in the context of three-phase devices, it should be clear that the technique applies equally well to four-phase devices and, with some precautions, to two-phase devices with directional electrodes. For example, if the input gates themselves are directional electrodes, then the arrangement represented in FIG. 7 does not work since charge cannot equilibrate across the barrier part of the input gates. The arrangement illustrated in FIGS. 8 and 9, however, work, provided that the equilibration path connects the storage parts of the input gates.

Implementations using more than one electrode level (i.e., polysilicon I or polysilicon II) are most suitable for the realization of the input structure with the extra separation gate. The gate, in this instance, is placed in the second electrode level to minimize the active area of this gate and to provide easy accessibility. A symmetrical differential input using the separation gate approach has been implemented with two levels of polysilicon in the context of a chip containing several differential charge-coupled delay lines.

A device with a charge-splitting input was made with the electrode layout indicated in FIG. 9 and included an on-chip differential amplifier (not shown) with polysilicon I and polysilicon II capacitors to control the overall gain of the device and for frequency compensation of the amplifier. A four-phase transfer electrode structure with two levels of polysilicon was used to provide the delay elements normal to CTDs. Transfer pulses and pulses required for the input and output circuits were provided by a line of logic cells (not shown) also provided on the chip. The chip operated with two voltages, +12 V and −5 V; all intermediate voltages required were generated by on-chip voltage dividers.

The chips were fabricated using an n-channel process with self-aligned thick field oxide over an ion implanted channel-stopping region, two levels of polysilicon, an ion implant to tailor the threshold under one of the polysilicon levels, and a self-aligned diffusion to form the sources and drains all in accordance with well-understood techniques.

In operation, charge packets of a fixed size were generated in each clock cycle in a metering well using the normal "fill and spill" (charge preset) method. These packets were then moved subsequently to the actual signal input, i.e., into two potential wells generated under a split electrode which were connected via a conducting channel. These two potential wells are created by electrodes in polysilicon level I to which the input voltages were applied. The conducting channel was created by an electrode in polysilicon level II which allows, at first, the charge packets under the two electrodes to equilibrate so that the charge difference between them was a linear function of the voltage difference on the electrodes. Subsequently, this electrode was turned off to separate the two partial charge packets.

In this embodiment, the dimension of the gates GA, GB and SG were 40 $\mu$m×100 $\mu$m and 7×7 $\mu$m. The dimensions of the transfer electrodes were 9 and 6 by 100 $\mu$m.

Although the invention has been described in terms of an input region adapted to divide a given charge into two packets, it is specifically contemplated herein to encompass input regions adapted to divide charge into three or more packets, or into delibrately unequal packets. In this last instance, equal or unequal signal voltages are contemplated.

What has been described is considered merely illustrative of the principles of this invention. Therefore, various modifications can be devised by those skilled in the art within the spirit and scope of the invention as encompassed by the following claims.

We claim:

1. A charge transfer device comprising a layer of semiconductor material in which first charge packets can be moved along a first path from an input portion in response to a succession of localized electric fields, and electrical conductor means including a first set of electrodes coupled to said layer for generating said fields in a manner to move said first charge packets along said first path, wherein said input portion includes means for generating signal independent charge packets, said means comprising a second electrode coupled to said layer and an input diode along with clock means for applying clock pulses to said second electrode and said input diode, and input means comprising first and second input gate electrodes and an input signal source for applying to said first and second gate electrodes information input signals for dividing each of said signal independent charge packets into first and second charge packets, each of said first charge packets being linearly related to said information input signals, said first charge packet being positioned for movement along said first path.

2. A charge transfer device in accordance with claim 1 wherein said electrical conductor means also includes first and second of electrodes coupled to said layer for generating said fields in a manner to move said second charge packets along a second path and each of said second charge packets is positioned for movement along said second path.

3. A charge transfer device in accordance with claim 2 wherein said means for dividing includes first and second input gates proximate said layer and responsive to first and second signals, respectively, for separating said signal independent charge packet into first and second charge packets.

4. A charge transfer device in accordance with claim 3 wherein said means for dividing include a gate electrode between said first and second electrodes.

5. A charge transfer device including
a layer of semiconductor material in which first and second charge packets can be moved from an input region along first and second paths in response to successions of localized electric fields, electrical conductor means including first and second sets of electrodes coupled to said layer for providing said localized electric fields for moving said first and second charge packets along said first and second paths, respectively,
means responsive to a clock pulse for generating a charge in said input region, input means comprising first and second input gate electrodes and means for applying to said first and second input gate electrodes an information input gate signal for dividing said charge into said first and second charge packets in accordance with said input gate signal.

6. A charge transfer device in accordance with claim 5 wherein said last-mentioned means comprises electrodes of substantially identical geometries.

* * * * *

UNITED STATES PATENT AND TRADEMARK OFFICE
CERTIFICATE OF CORRECTION

PATENT NO. : 4,210,925
DATED : July 1, 1980
INVENTOR(S) : William R. Morcom, et al It is certified that error appears in the above-identified patent and that said Letters Patent are hereby corrected as shown below:

Column 2, line 19, delete "diectrically", add -- dielectrically --

Column 3, line 21, delete "matter", add -- manner --

Column 3, line 26, delete "intergrated", add -- integrated --

Column 3, line 42, delete "structural produce", add -- structure produces --

Claim 6, Delete Claim 6 in its entirety

Claim 7, first line, delete "6", add -- 18 --

Claim 10, first line, delete "6", add -- 18 --

Claim 11, first line, delete "6", add -- 18 --

Claim 12, first line, delete "6", add -- 18 --

Claim 13, first line, delete "6", add -- 18 --

UNITED STATES PATENT AND TRADEMARK OFFICE
CERTIFICATE OF CORRECTION

PATENT NO. : 4,210,925

DATED : July 1, 1980

INVENTOR(S) : William R. Morcom, et al

Page 2 of 2

It is certified that error appears in the above-identified patent and that said Letters Patent are hereby corrected as shown below:

Claim 16, last line, after the word "epitaxial", insert "layer"

Claim 18, first line, delete "intergrated", add -- integrated --

Signed and Sealed this

Ninth Day of December 1980

[SEAL]

Attest:

SIDNEY A. DIAMOND

Attesting Officer

Commissioner of Patents and Trademarks

UNITED STATES PATENT AND TRADEMARK OFFICE
CERTIFICATE OF CORRECTION

PATENT NO. : 4,210,825

DATED : July 1, 1980

INVENTOR(S) : Ronald E. Crochiere, Carlo H. Sequin, and Michael F. Tompsett

It is certified that error appears in the above-identified patent and that said Letters Patent are hereby corrected as shown below:

Column 4, line 60, "$C_{ox}2$" should read --$C_{ox}^2$--. Column 5, line 30, that portion of the formula reading "$-\frac{A_A A_B}{A_A + A_B}$" should read --$+\frac{A_A A_B}{A_A + A_B}$--. Column 7, line 18, "charged" should read --charge--. Column 10, line 16, delete "of".

Signed and Sealed this

*Fifth* Day of *May 1981*

[SEAL]

Attest:

RENE D. TEGTMEYER

*Attesting Officer*   *Acting Commissioner of Patents and Trademarks*